United States Patent
Blanco et al.

[11] Patent Number: 5,963,851
[45] Date of Patent: Oct. 5, 1999

[54] AUTOMATIC FREQUENCY CONTROL SYSTEM USING MULTIPLE THRESHOLD LEVELS AND METHOD OF USING SAME

[75] Inventors: Alejandro G. Blanco, Plantation; Richard S. Young, Weston; Shahriar Emami, Sunrise; Jianping Miller, Plantation, all of Fla.

[73] Assignee: Motorola, Inc., Schaumburg, Ill.

[21] Appl. No.: 08/835,364

[22] Filed: Apr. 7, 1997

[51] Int. Cl.$^6$ ................... H04Q 7/32; H04Q 7/30
[52] U.S. Cl. ............ 455/75; 455/182.2; 455/192.2; 370/344
[58] Field of Search ............... 455/75, 182.1, 455/182.2, 182.3, 192.1, 192.2, 192.3, 76, 77, 82; 370/344

[56] References Cited

U.S. PATENT DOCUMENTS

| | | | |
|---|---|---|---|
| 5,493,714 | 2/1996 | Cahill | 455/259 |
| 5,564,091 | 10/1996 | Goldinger | 455/226.2 |
| 5,694,389 | 12/1997 | Seki et al. | 370/208 |
| 5,697,068 | 12/1997 | Salvi et al. | 455/76 |
| 5,774,799 | 6/1998 | Croft et al. | 455/192.2 |

*Primary Examiner*—Dwayne D. Bost
*Assistant Examiner*—Alan T. Gantt
*Attorney, Agent, or Firm*—Frank M. Scutch, III

[57] ABSTRACT

A radio device requires a tunable transceiver such that the transceiver can be accurately set to a desired frequency. When a signal with known frequency accuracy is being received, an offset detector can determine the frequency offset generated by the transceiver due to improper tuning. An automatic frequency control (AFC) system (100) is comprised of a tunable transceiver, an offset detector (103) and an AFC control processor (105) for utilizing information from the offset detector to reduce the inaccuracy in frequency by tuning the transceiver towards the received signal frequency. The AFC control processor (105) utilizes one of more threshold levels for defining a maximum correction threshold (311) based upon the desired maximum offset correction. These thresholds are used by the AFC control processor (105) to efficiently control the predetermined frequency range of the tunable transceiver (101) for most efficient operation.

7 Claims, 2 Drawing Sheets

AUTOMATIC FREQUENCY CONTROL SYSTEM USING MULTIPLE THRESHOLD LEVELS AND METHOD OF USING SAME

TECHNICAL FIELD

This invention relates in general to radio transceivers and more particularly to frequency control in two-way radio transceivers.

BACKGROUND

Automatic frequency control (AFC) is employed in two-way radio transceivers to compensate for any difference in frequency between the received signal frequency and the transceiver operating frequency. As is well known, AFC can be used for automatically compensating for frequency drifts in frequency generation devices or oscillators in radio transceivers due to aging, temperature fluctuations, and other effects. Thus, in both analog and digital communication, AFC is used in the radio transceiver to reduce and/or eliminate received and transmitted signal degradation and distortion due to the presence of this frequency difference.

Particularly in a microcontroller controlled radio transceiver, the microcontroller is used to control operation of AFC. Typically, the AFC is not operated in its most efficient manner since there are many factors to be considered in its implementation. For example, both the radio's operating environment and mode of transmission are important. Should the radio be operated in a portion of crowded radio spectrum or with transmission modes having a wide bandwidth, this may interface with the radio transceiver's capability to be on the proper frequency to receive or transmit information or data. Even in a transceiver utilizing a relatively narrow bandwidth such as digital frequency modulation (FM), AFC control will be required assuming that any frequency offset is larger than the oscillator step size and distortion due to AFC is not a factor. Moreover since there may be undesired signals in the frequency band of operation, the transceiver may inadvertently be tuned to these signals when in fact no tuning was necessary. Also, multiple spurious signals are often present, where the AFC may move the transceiver operating frequency to a great extent from the desired operating. If many undesired signals exist, the transceiver can be moved outside operating range.

Thus, the need exists to provide a system and method used with a microcontroller in a radio receiver or transceiver, for selecting the proper amount of AFC tuning compensation during varying signal conditions. This technique will ultimately prevent signal degradation and/or distortion due to improper tuning using AFC in the radio transceiver.

DETAILED DESCRIPTION OF THE PREFERRED EMBODIMENT

Figure 1:
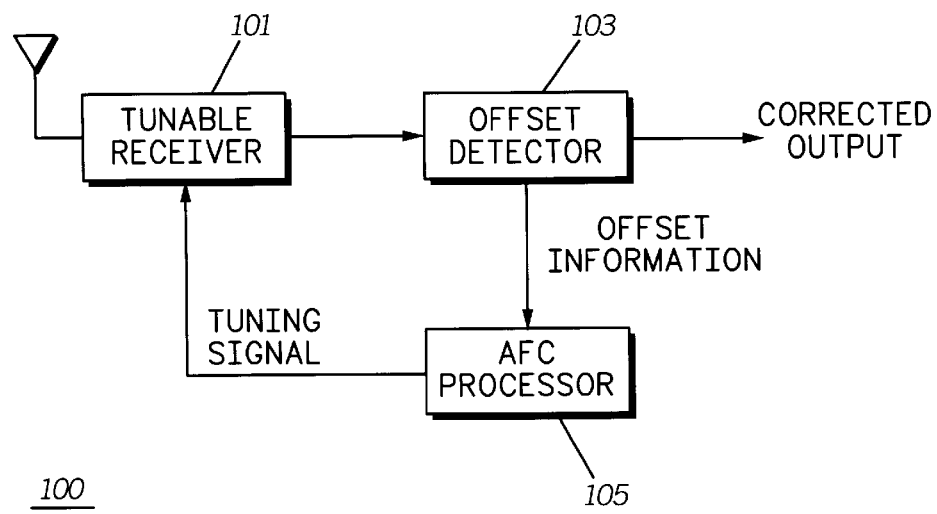
FIG. 1 is a block diagram showing operation of an automatic frequency control system with a radio transceiver.

Referring now to FIG. 1, a block diagram of an automatic frequency control (AFC) system 100 includes a tunable transceiver 101, an offset detector 103 and a processor 105. The tunable transceiver 101 is used for receiving and decoding radio frequency (RF) input signal information in either an analog or digital format and for transmitting such information. The processor 105, among other things, programs an operating frequency into the tunable transceiver 101, such that if the tuning is correct, the transceiver will be operating at the programmed frequency. An offset detector 103 is attached to the tunable transceiver 101 and is used for detecting the amount of frequency offset or difference between the transceiver operating frequency and a received frequency.

The offset detector 103 works by extracting the direct current (DC) component of the demodulated signal. This DC value is proportional to the frequency offset between the transmitted frequency and transceiver frequency. The offset detector can be implemented on a digital signal processor (DSP) such as that manufactured by Motorola, Inc. No. DSP56001. The offset frequency is then passed on to the processor 105.

The processor 105 is a microcontroller such as that manufactured by Motorola, Inc. No. MC68HC11 or the like, that can rapidly compile, process and interpret the offset frequency information. The processor 105 uses the offset information and the thresholds to determine whether the transceiver tuning should be adjusted from its present setting. The processor 105 generates a tuning signal or tuning word that tunes the transceiver 101. It should be evident to those skilled in the art that the offset detector 103 may be integrated into the processor 105.

Figure 2:
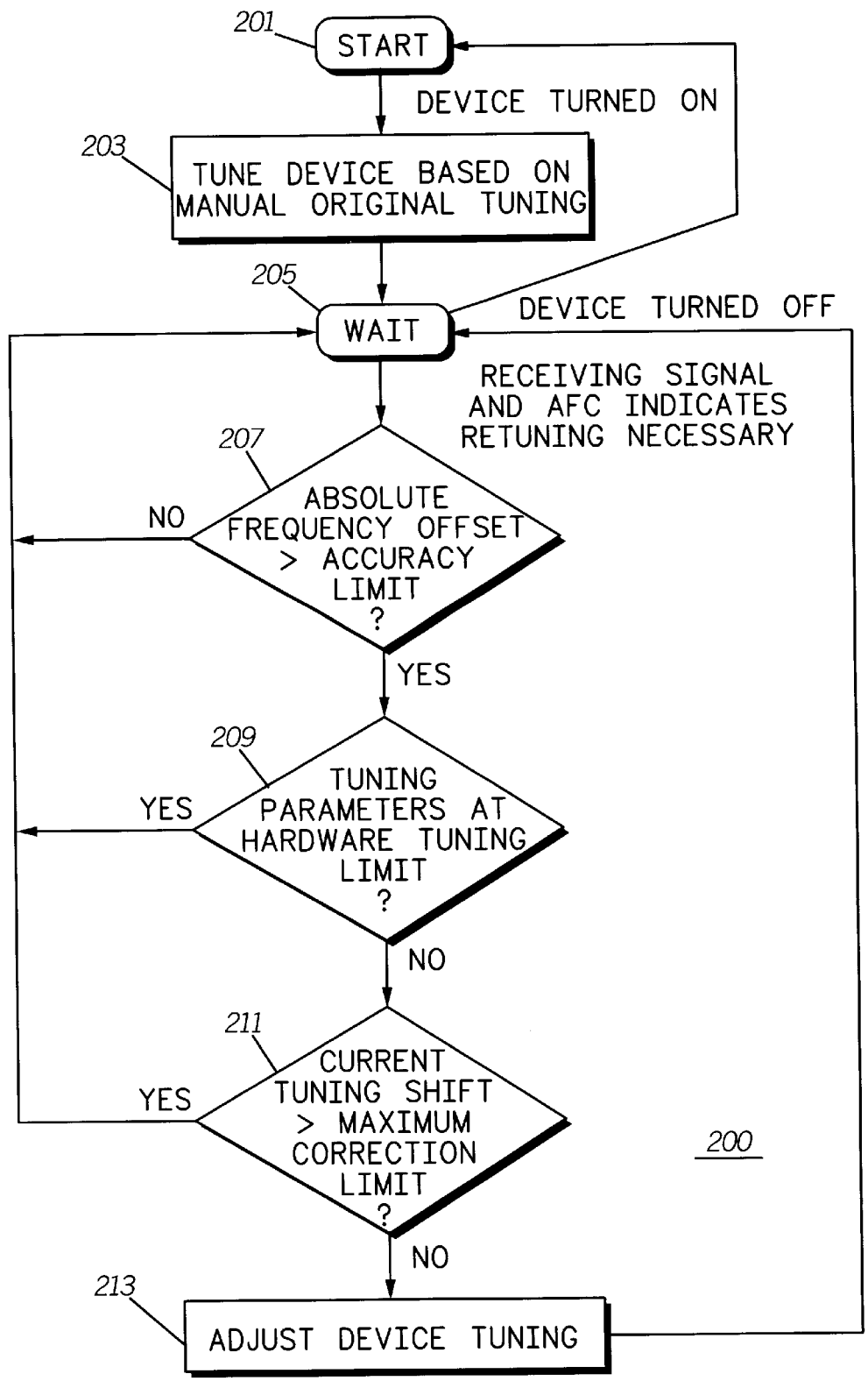
FIG. 2 is a flow chart showing a method for use in a radio transceiver for controlling an automatic frequency control using multiple threshold levels according to the preferred embodiment of the invention.

In FIG. 2, a flowchart shows the preferred method 200 used by the processor 105 for selecting a correct tuning signal. Initially, the radio receiver or transceiver is activated 201 and the transceiver is tuned 203 based on its initial preset tuning frequency. This process is then halted 205 until the offset detector 103 detects an offset indicating that the transceiver operating frequency may need to be tuned or altered to an incoming signal frequency.

When transceiver retuning is necessary, one or more thresholds or limits are measured to determine the amount or degree to which the transceiver tuning is to be changed by the AFC. The first threshold is an accuracy limit threshold 207. If the offset represents an absolute difference between the current transceiver operating frequency and actual received signal frequency, that is below the accuracy limit 207, the AFC will not work to correct the frequency difference. This avoids unneeded moving or oscillating around an ideal but unrealizable setting, and reduces processing requirements.

Secondly, a hardware tuning threshold 209 is employed that depends on the inherent tuning specifications of the specific transceiver. It will be evident to those skilled in the art that each transceiver will have a frequency range limited by the design and hardware used in the design. The hardware tuning threshold 209 is used with the measurement of the absolute difference between the current transceiver operating frequency and actual received signal frequency. The hardware tuning limit threshold 209 is defined by a predetermined radio transceiver specification. Should the offset require a correction placing the tuning setting outside the tuning specification or passband of the transceiver, i.e. outside the hardware tuning threshold 209, the AFC will not be activated to move the transceiver tuning.

Finally, the third threshold is the maximum correction threshold 211. This is a maximum or absolute difference in frequency that the transceiver tuning will be limited to with respect to the initial tuning. Thus, depending on the offset measurement from the offset detector 103, the AFC will not move or tune the transceiver receiving frequency if the absolute difference is above the maximum correction threshold 211.

Figure 3:
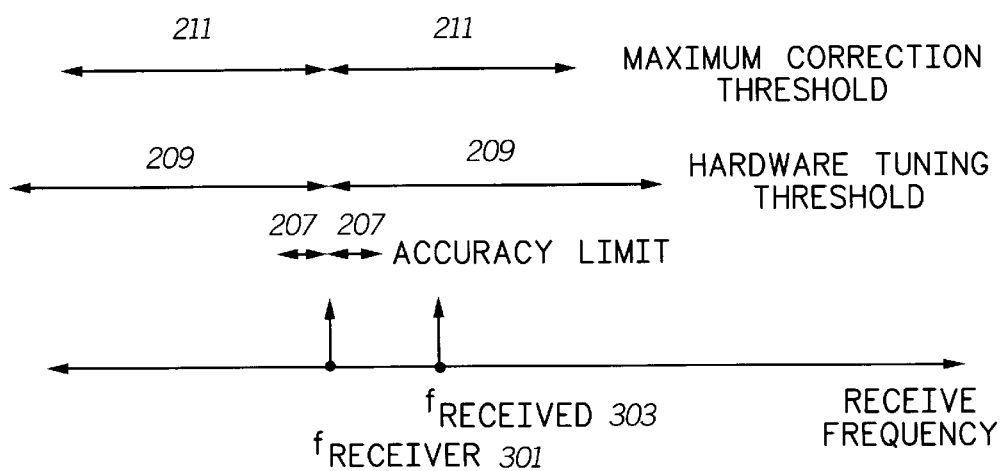
FIG. 3 is a diagram illustrating operation of the preferred method of the invention showing operation of the automatic frequency control with one or more thresholds defined as an accuracy limit, hardware tuning threshold and maximum correction threshold.

The first, second and third thresholds are used by the AFC processor to alter or adjust 213 the tuning of the tunable receiver of the transceiver 101 to the proper operating frequency. Moreover in FIG. 3, a diagram 300 illustrates a graphical relationship between the transceiver operating frequency 301 and the actual or incoming receiver frequency 303. Additionally, the receiver accuracy limit 207, hardware tuning threshold 209 and maximum correction threshold 211 are also shown in relation to the transceiver operating frequency 301. Those skilled in the art will recognize that the absolute difference is first measured between the transceiver operating frequency 301 and the incoming receiver frequency 303. This difference is then compared with the accuracy limit 207, hardware tuning threshold 209 and maximum correction threshold 211. This information is then processed by the processor 105 for providing stable and reliable operation of the AFC and tunable transceiver.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An automatic frequency control (AFC) system comprising:
   a tunable transceiver for receiving and transmitting signals within a predetermined frequency range;
   an offset detector for determining a difference in frequency between a receive signal frequency and a transceiver operating frequency;
   a control processor for utilizing information from the offset detector to reduce the difference in frequency by moving the passband of the tunable transceiver towards the receive signal frequency where the control processor defines an accuracy limit threshold based upon the proximity of the receive signal frequency to the transceiver operating frequency, a maximum correction threshold based upon a predetermined maximum frequency correction limit, and a hardware tuning threshold based upon a predetermined tunable transceiver specification; and
   further wherein the accuracy limit threshold, maximum correction threshold and the hardware tuning threshold are used for efficiently controlling the predetermined frequency range of the tunable transceiver for efficient operation.

2. An AFC system as in claim 1 wherein the offset detector is integrated with the control processor.

3. A radio transceiver having a detector and at least one processor for controlling an automatic frequency control (AFC) tuning of the radio transceiver, the at least one processor utilizing a method comprising the steps of:
   determining if a frequency offset between the transceiver operating frequency and a received signal is larger than a first threshold limit, where the first threshold limit is determined by a predetermined absolute frequency offset;
   determining if a frequency offset between the transceiver operating frequency and a received signal is larger than a second threshold limit, where the second threshold limit is determined by a predetermined frequency specification of the radio transceiver;
   determining if a frequency offset between the transceiver operating frequency and the received signal is within a third threshold limit, where the third threshold limit is a predetermined maximum frequency correction; and
   wherein the first threshold limit, second threshold limit and third threshold limit are used by the at least one processor to ensure stable operation of AFC.

4. A radio transceiver as in claim 3 wherein the first threshold limit is an accuracy limit.

5. A radio transceiver as in claim 4 wherein the second threshold limit is a hardware tuning threshold.

6. A radio transceiver as in claim 5 wherein the third threshold limit is a maximum correction threshold.

7. A method for use by at least one control processor for adjusting an automatic frequency control (AFC) in a radio transceiver receiving signals at a transceiver operating frequency comprising the steps of:
   determining a frequency difference between the transceiver operating frequency and an incoming signal frequency;
   comparing the frequency difference with a predetermined accuracy limit defined by a predetermined maximum frequency offset of the transceiver operating frequency from an actual receive frequency;
   comparing the frequency difference with a predetermined hardware tuning threshold defined by a predetermined radio transceiver specification;
   comparing the frequency difference with a predetermined maximum correction threshold defined by a predetermined maximum correction from the transceiver operating frequency; and
   processing at least one of the comparing steps in a microprocessor to provide correction information to stabilize the automatic frequency control to provide stable operation of the radio transceiver.

* * * * *